(12) United States Patent
Hiraoka et al.

(10) Patent No.: US 9,673,382 B2
(45) Date of Patent: Jun. 6, 2017

(54) ACTUATOR

(71) Applicants: Panasonic Corporation, Osaka (JP); IMEC vzw, Leuven (BE); Universiteit Gent, Ghent (BE)

(72) Inventors: Maki Hiraoka, Nara (JP); Paolo Fiorini, Leuven (BE); Bjorn Vandecasteele, Leuven (BE)

(73) Assignees: Panasonic Corporation, Osaka (JP); IMEC vzw, Leuven (BE); Universiteit Gent, Ghent (BE)

( * ) Notice: Subject to any disclaimer, the term of this patent is extended or adjusted under 35 U.S.C. 154(b) by 534 days.

(21) Appl. No.: 14/366,133

(22) PCT Filed: Dec. 17, 2012

(86) PCT No.: PCT/JP2012/083177
§ 371 (c)(1),
(2) Date: Jun. 17, 2014

(87) PCT Pub. No.: WO2013/094713
PCT Pub. Date: Jun. 27, 2013

(65) Prior Publication Data
US 2014/0345697 A1 Nov. 27, 2014

(30) Foreign Application Priority Data
Dec. 19, 2011 (JP) .................. 2011-276803

(51) Int. Cl.
*H01L 41/09* (2006.01)
*H01L 41/193* (2006.01)
(Continued)

(52) U.S. Cl.
CPC ............ *H01L 41/193* (2013.01); *F03G 7/005* (2013.01); *F16K 31/005* (2013.01);
(Continued)

(58) Field of Classification Search
USPC ........................................ 310/328, 366, 800
See application file for complete search history.

(56) References Cited

U.S. PATENT DOCUMENTS 7,679,268 B2   3/2010   Yokoyama et al.
7,733,000 B2 * 6/2010   Kudoh ................... F03G 7/005
                                              204/242
(Continued)

FOREIGN PATENT DOCUMENTS

JP      3959104         8/2007
WO      2007/084796     7/2007

OTHER PUBLICATIONS

Office Action and Search Report issued Mar. 24, 2016 in Chinese Application No. 201280062615.6, with English translation of Search Report.

(Continued)

*Primary Examiner* — Thomas Dougherty
(74) *Attorney, Agent, or Firm* — Wenderoth, Lind & Ponack, L.L.P.

(57) ABSTRACT

In order to solve the problem of the generation of the interspace between layers, the present invention provides an actuator including: a conductive polymer layer; an ambient temperature molten salt layer; and an opposite electrode layer; wherein the ambient temperature molten salt layer is interposed between the conductive polymer layer and the opposite electrode layer, the ambient temperature molten salt layer includes an adhesive layer in the inside thereof; one surface of the adhesive layer adheres to the conductive polymer layer; and the other surface of the adhesive layer adheres to the opposite electrode layer.

7 Claims, 9 Drawing Sheets

(51) Int. Cl.
　　　*F03G 7/00*　　　　(2006.01)
　　　*F16K 31/00*　　　(2006.01)
　　　*H01L 41/04*　　　(2006.01)
(52) U.S. Cl.
　　　CPC ............ *H01L 41/042* (2013.01); *H01L 41/09* (2013.01); *Y10T 137/0318* (2015.04)

(56) References Cited

U.S. PATENT DOCUMENTS

2007/0257582 A1　　11/2007　Yokoyama et al.
2009/0308737 A1*　12/2009　Kudoh .................. B81B 3/0021
　　　　　　　　　　　　　　　　　　　　　　　　　　　204/242

OTHER PUBLICATIONS

International Search Report (ISR) issued Jan. 10, 2014 in International (PCT) Application No. PCT/JP2012/083177.
Written Opinion issued Jan. 10, 2014 in International (PCT) Application No. PCT/JP2012/083177.
M. Hiraoka et al., "High Pressure Pump as Lab on Chip Component for Micro-Fluidic Integrated System", IEEE, US, pp. 1139-1142, XP031982618, ISBN: 978-1-4244-9632-7, Jan. 23, 2011.

* cited by examiner

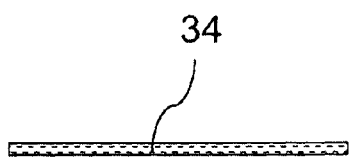
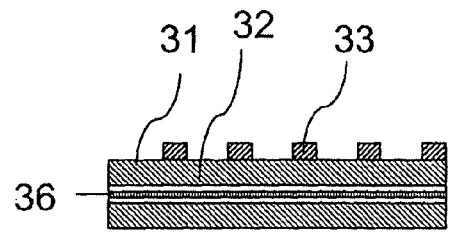
Fig.7A   Fig.7B
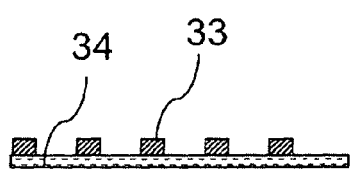
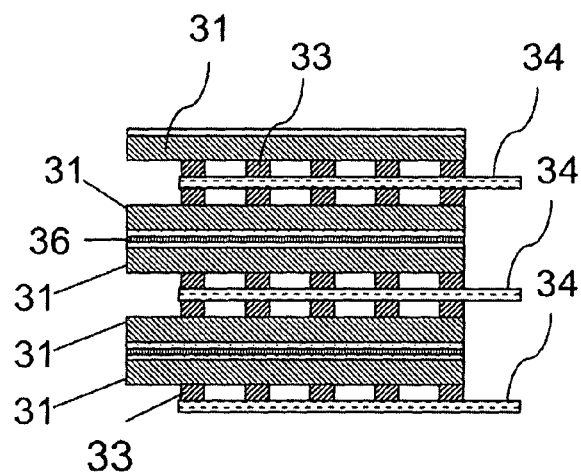
Fig.7C
Fig.7D

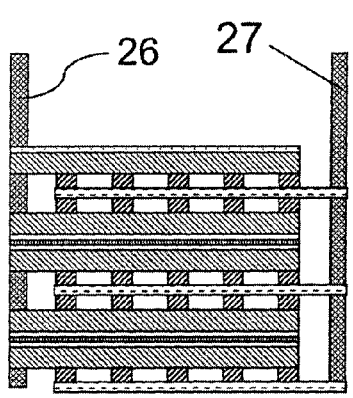
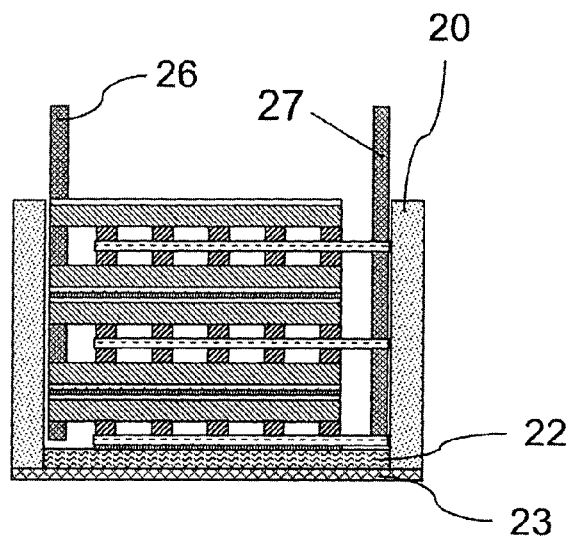
Fig.8A  Fig.8B
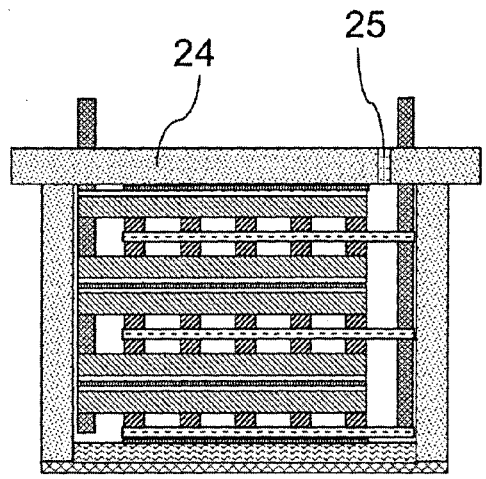
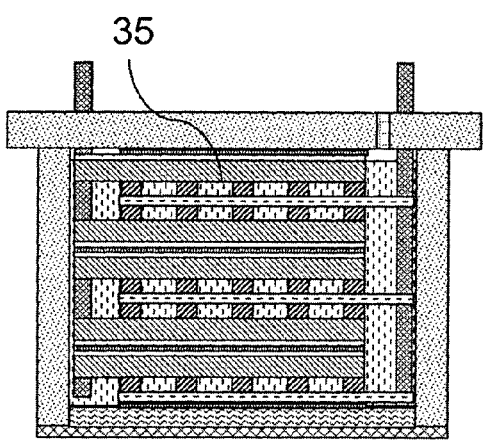
Fig.8C  Fig.8D

ACTUATOR

TECHNICAL FIELD

The present invention relates to an actuator.

BACKGROUND ART

Patent Literature 1 discloses an actuator comprising a conductive polymer layer, an ambient temperature molten salt layer, and an electrode layer. More particularly, see FIG. 13B included in Patent Literature 1.

FIG. 1 shows a schematic cross-sectional view of the actuator 1 shown in Non Patent Literature 1. The actuator 1 comprises a laminate 21. The actuator 1 shown in FIG. 1 comprises two laminates 21a-21b.

The laminate 21a comprises a conductive polymer layer 31, an opposite electrode layer 34, and an ambient temperature molten salt layer 35. The laminate 21a shown in FIG. 1 comprises a first conductive polymer layer 31a, a first ambient temperature molten salt layer 35a, an opposite electrode layer 34, a second ambient temperature molten salt layer 35b, and a second conductive polymer layer 31b.

Support layers 32 are formed on the obverse and reverse surfaces of the laminate 21a. In more detail, a first support layer 32a and a second support layer 32b are formed on the obverse and reverse surfaces of the laminate 21a, respectively.

The laminate 21a (hereinafter, referred to as "first laminate 21a") is stacked on the laminated on the laminate 21b (hereinafter, referred to as "second laminate 21b"). An adhesive film 36 is interposed between two laminates 21a-21b. The adhesive film 36 is interposed between the second support layer 32b included in the first laminate 21a and the first support layer 32a included in the second laminate 21b so as to adhere these layers to each other.

Each conductive polymer layer 31 is electrically connected to a first electrode 26 provided on the one side of the actuator 1. Each opposite electrode layer 34 is electrically connected to the second electrode 27 provided on the other side of the actuator 1.

CITATION LIST

Patent Literature

[Patent Literature 1] U.S. Pat. No. 7,679,268 (corresponding to Japanese Patent No. 3959104)

Non Patent Literature

[Non Patent Literature 1] M. Hiraoka et al. "HIGH PRESSURE PUMP AS LAB ON CHIP COMPONENT FOR MICRO-FLUIDIC INTEGRATED SYSTEM", IEEE MEMS 2011 Technical Journal, 1139-1142

SUMMARY OF THE INVENTION

Technical Problem

Through the first electrode 26 and the second electrode 27, a negative voltage and a positive voltage are applied to the conductive polymer layers 31 and the opposite electrode layers 34, respectively. When this voltage difference is applied, the thickness of the conductive polymer layer 31 is increased. This is because cations are moved from the ambient temperature molten salt layer 35 to the conductive polymer layer 31.

Then, a positive voltage and a negative voltage are applied to the conductive polymer layers 31 and the opposite electrode layers 34, respectively. When this voltage difference is applied, the thickness of the conductive polymer layer 31 is decreased so as to return the actuator 1 to its original state. This is because the canions are moved from the conductive polymer layer 31 to the ambient temperature molten salt layer 35. In this way, the actuator 1 serves.

However, as shown in FIG. 2, when the increase and the decrease of the thickness of the conductive polymer layer 31 are repeated, an interspace is generated between these layers. Due to this interspace, it becomes difficult for the canions are moved between the conductive polymer layer 31 and the ambient temperature molten salt layer 35. As a result, the actuator 1 fails to serve.

The purpose of the present invention is to provide an actuator solving this problem.

Solution to Problem

The present invention directed to the following items 1-6 solves the above-mentioned problem.

1. An actuator comprising:
   a conductive polymer layer 31;
   an ambient temperature molten salt layer 35; and
   an opposite electrode layer 34; wherein
   the ambient temperature molten salt layer 35 is interposed between the conductive polymer layer 31 and the opposite electrode layer 34,
   the ambient temperature molten salt layer 35 comprises an adhesive layer 33 in the inside thereof;
   one surface of the adhesive layer 33 adheres to the conductive polymer layer 31; and
   the other surface of the adhesive layer 33 adheres to the opposite electrode layer 34.

2. The actuator according to the item 1, wherein
   the ambient temperature molten salt layer 35 comprises a plurality of adhesive layers 33 in the inside thereof; and
   the plurality of adhesive layers 33 are, dispersed in the ambient temperature molten salt layer 35 when viewed in the perspective top view.

3. A method for driving an actuator, the method comprising:
   (a) preparing the actuator comprising:
   a conductive polymer layer 31;
   an ambient temperature molten salt layer 35; and
   an, opposite electrode layer 34; wherein
   the ambient temperature molten salt layer 35 is interposed between the conductive polymer layer 31 and the opposite electrode layer 34,
   the ambient temperature molten salt layer 35 comprises an adhesive layer 33 in the inside thereof;
   one surface of the adhesive layer 33 adheres to the conductive polymer layer 31; and
   the other surface of the adhesive layer 33 adheres to the opposite electrode layer 34;
   (b) applying a negative voltage and a positive voltage to the conductive polymer layer 31 and the opposite electrode layer 34, respectively, to increase the thickness of the conductive polymer layer 31; and
   (c) applying a positive voltage and a negative voltage to the conductive polymer layer 31 and the opposite electrode layer 34, respectively, to decrease the thickness of the conductive polymer layer 31.

4. The method according to the item 3, wherein
the ambient temperature molten salt layer 35 comprises a plurality of adhesive layers 33 in the inside thereof; and
the plurality of adhesive layers 33 are dispersed in the ambient temperature molten salt layer 35 when viewed in the perspective top view.

5. A method for controlling a flow of an fluid flowing through a flow path 8, the method comprising;
(a) preparing the actuator comprising:
a conductive polymer layer 31;
an ambient temperature molten salt layer 35; and
an opposite electrode layer 34; wherein
the ambient temperature molten salt layer 35 is interposed between the conductive polymer layer 31 and the opposite electrode layer 34,
the ambient temperature molten salt layer 35 comprises an adhesive layer 33 in the inside thereof;
one surface of the adhesive layer 33 adheres to the conductive polymer layer 31; and
the other surface of the adhesive layer 33 adheres to the opposite electrode layer 34;
(b) applying a positive voltage and a negative voltage to the conductive polymer layer 31 and the opposite electrode layer 34, respectively, to stop the flow of the fluid flowing through the flow path 8 by increasing the thickness of the conductive polymer layer 31; and
(c) applying a negative voltage and a positive voltage to the conductive polymer layer 31 and the opposite electrode layer 34, respectively, to flow the fluid through the flow path 8 by decreasing the thickness of the conductive polymer layer 31.

6. The method according to the item 5, wherein
the ambient temperature molten salt layer 35 comprises a plurality of adhesive layers 33 in the inside thereof; and
the plurality of adhesive layers 33 are dispersed in the ambient temperature molten salt layer 35 when viewed in the perspective top view.

7. The method according to the item 5, wherein
the actuator 1 is provided on a substrate 9;
in the step (b), a bottom surface of the actuator 1 is brought into contact with the actuator 1; and
in the step (c), the bottom surface of the actuator 1 is left from the actuator 1.

Advantageous Effects of Invention

In the actuator according to the present invention, the adhesive layer 33 prevents from generating the interspace between the layers, which causes the failure of the actuator.

BRIEF DESCRIPTION OF DRAWINGS

FIG. 7A shows a cross-sectional view in one step of the method for fabricating the actuator according to the embodiment.
FIG. 7B shows a cross-sectional view in the step subsequent to FIG. 6D.
FIG. 7C shows a cross-sectional view in the step subsequent to FIG. 7A.
FIG. 7D shows a cross-sectional view in the step subsequent to FIG. 7B and FIG. 7C.
FIG. 8A shows a cross-sectional view in the step subsequent to FIG. 7D.
FIG. 8B shows a cross-sectional view in the step subsequent to FIG. 8A.
FIG. 8C shows a cross-sectional view in the step subsequent to FIG. 8B.
FIG. 8D shows a cross-sectional view in the step subsequent to FIG. 8C.

DESCRIPTION OF EMBODIMENTS

Figure 1:
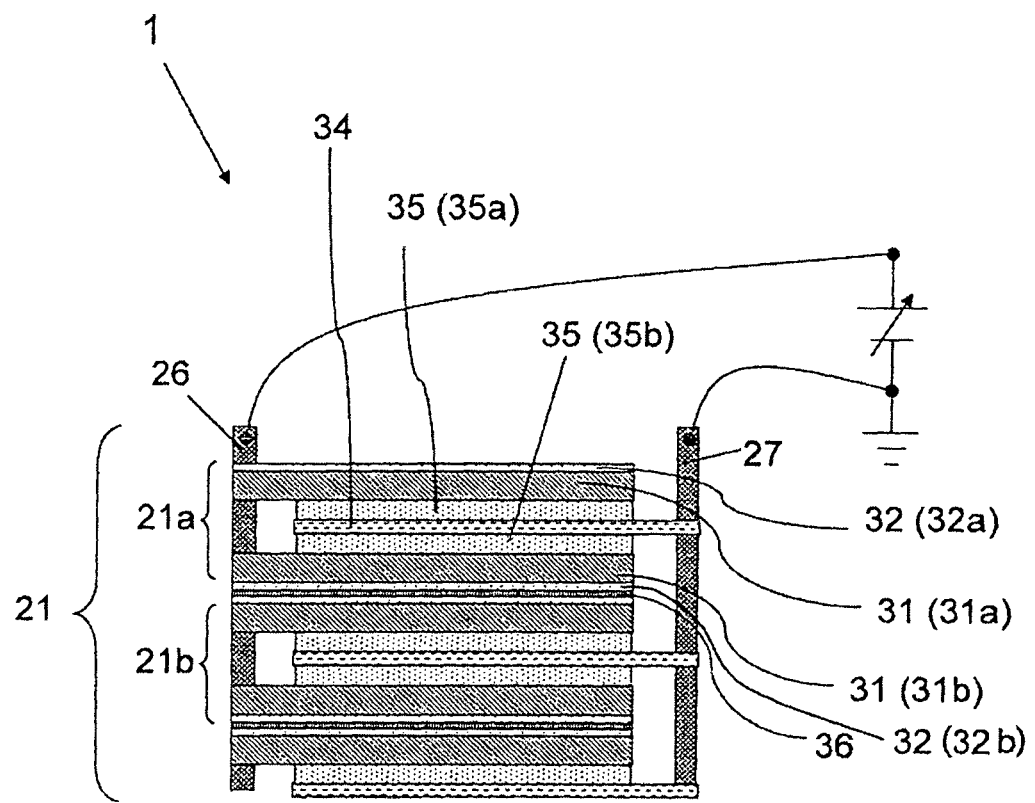
FIG. 1 shows a cross-sectional view of the conventional actuator.

Hereinafter, an embodiment of the present invention will be described. In the following description, the same components are designated by the same reference numerals, and hence repetitive description is omitted.

Figure 3:
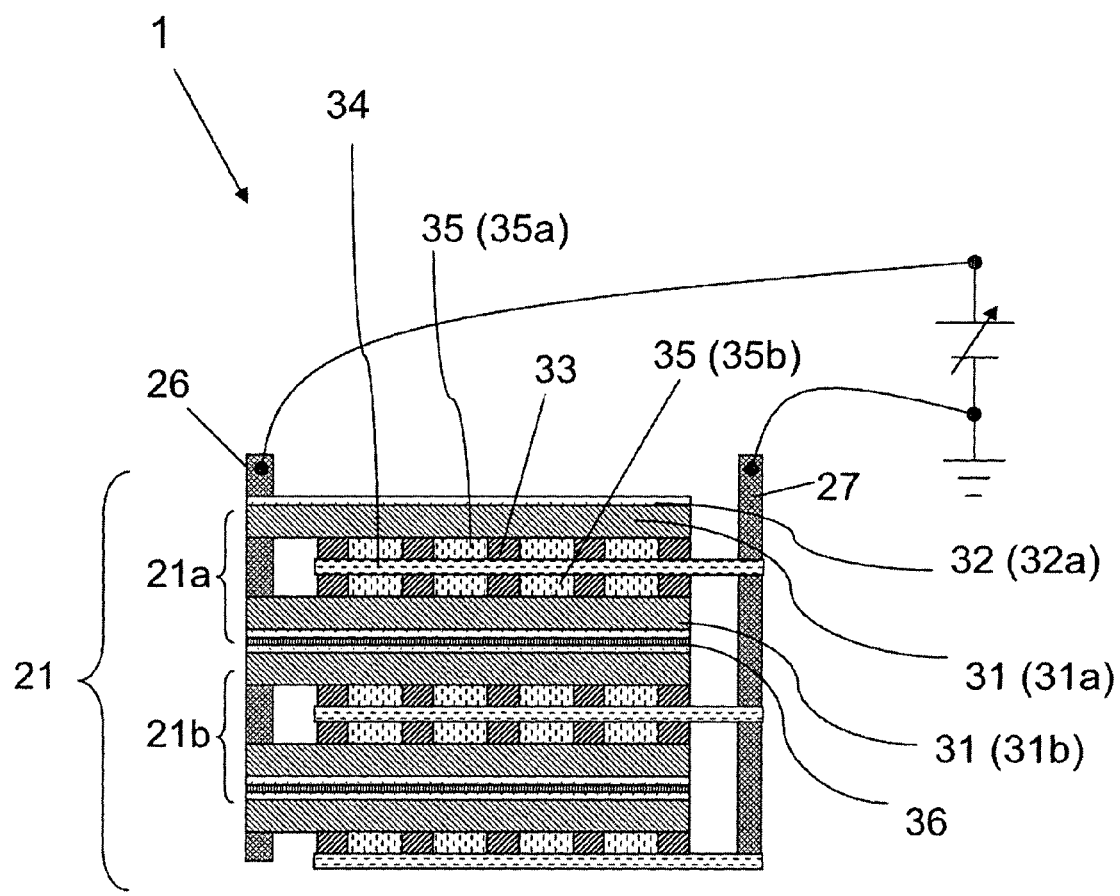
FIG. 3 shows a cross-sectional view of the actuator according to the embodiment.

As shown in FIG. 3. an adhesive layer 33 is added to the ambient temperature molten salt layer 35 included in the actuator 1. In other words, the ambient temperature molten salt layer 35 comprises the adhesive layer 33 in the inside thereof. The adhesive layer 33 may have electrical insulation property.

The one surface of the adhesive layer 33 adheres to the conductive polymer layer 31. The other surface of the adhesive layer 33 adheres to the opposite electrode layer 34. The number of the adhesive layer 33 may be one or more.

Figure 4:
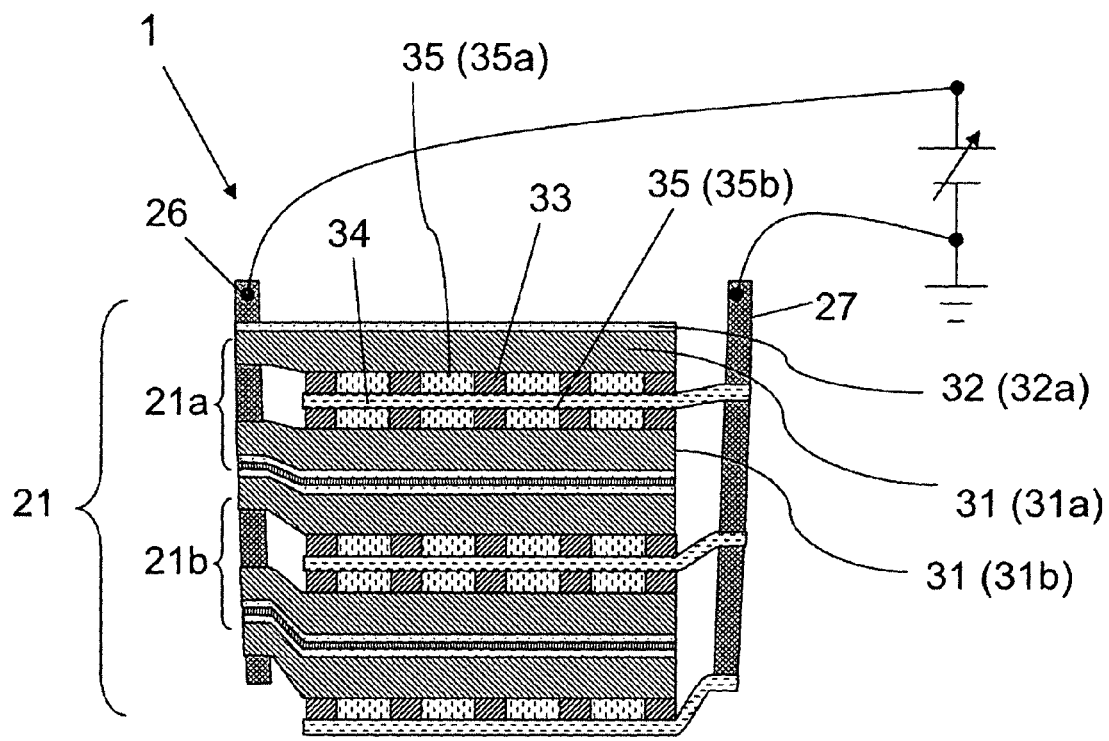
FIG. 4 shows a cross-sectional view of the actuator according to the embodiment.

Through the first electrode 26 and the second electrode 27, a negative voltage and a positive voltage are applied to the conductive polymer layers 31 and to the opposite electrode layers 34, respectively. As shown in FIG. 4, when this voltage difference is applied, the thickness of the conductive polymer layer 31 increases in a normal direction of the conductive polymer layer 31. Then, when a positive voltage and a negative voltage are applied to the conductive polymer layers 31 and to the opposite electrode layers 34, respectively, the thickness of the conductive polymer layer 31 decreases so as to returns the actuator 1 to the original state shown in FIG. 3.

Figure 2:
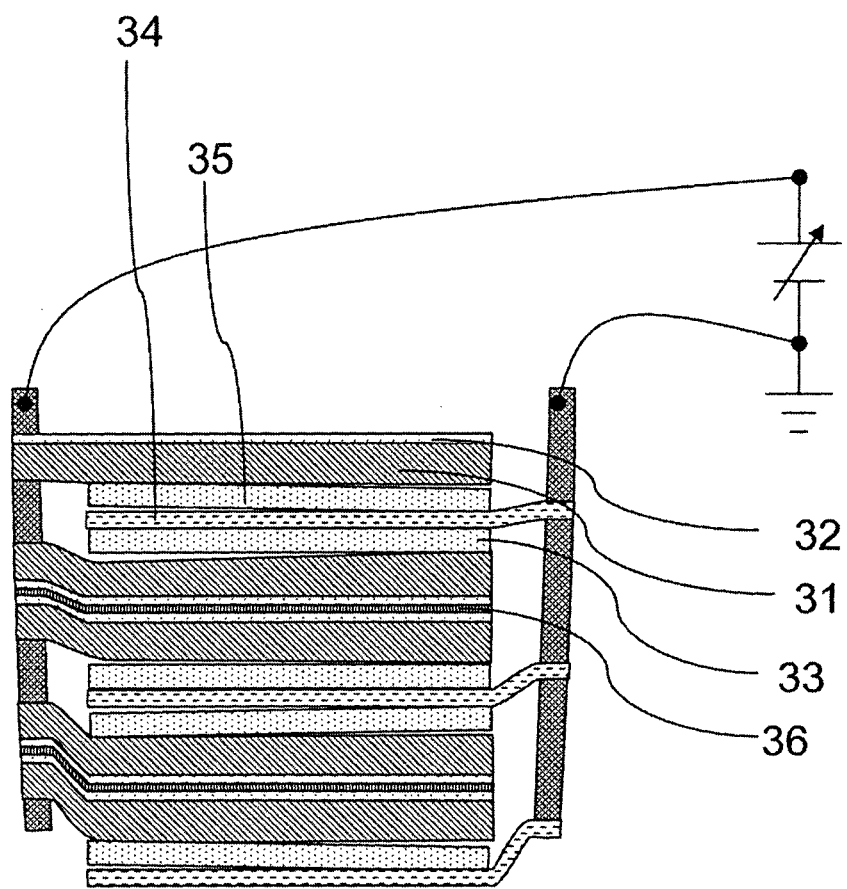
FIG. 2 shows a cross-sectional view of the conventional actuator.

Unlike the case shown in FIG. 2, the interspace is not generated due to the adhesive layer 33.

As shown in FIG. 4, it is preferred that the conductive polymer layer 31, the support layer 32, and the adhesive film 36 each have flexibility to follow the increase and the decrease of the conductive polymer layer 31.

Figure 9:
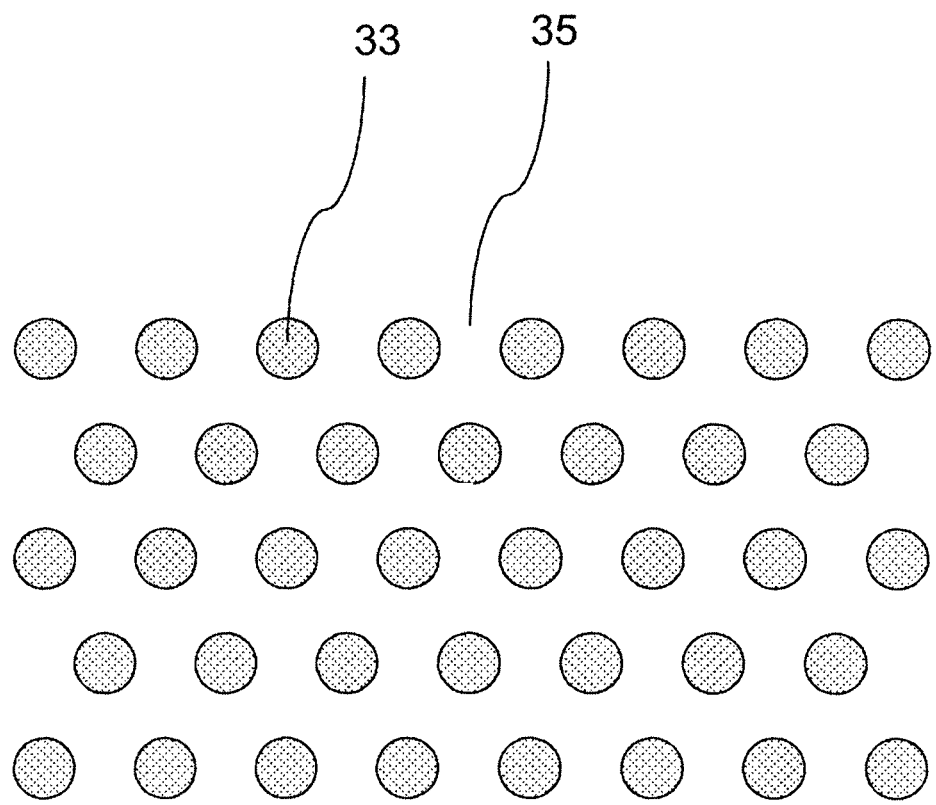
FIG. 9 shows a perspective top view of the inside of the ambient temperature molten salt layer 35.

As shown in FIG. 9, when the ambient temperature molten salt layer 35 viewed in the perspective top-view, it is preferable that a plurality of the adhesive layers 33 are disposed to be dispersed in the inside of the ambient temperature molten salt layer 35.

An example of a suitable material of the conductive polymer layer 31 is polypyrrole/bis(trifluoromethanesulfonyl)imide.

An example of a suitable adhesive layer 33 is an epoxide-based adhesive.

An example of a suitable material of the ambient temperature molten salt layer 35 is 1-ethyl-3-methylimidazolium/bis(trifluoromethanesulfonyl)imide.

An example of a suitable material of the opposite electrode layer 34 is polypyrrole/dodecyl benzene sulfonic acid.

Then, a method for controlling a flow of a fluid using the actuator 1 will be described.

Figure 5:
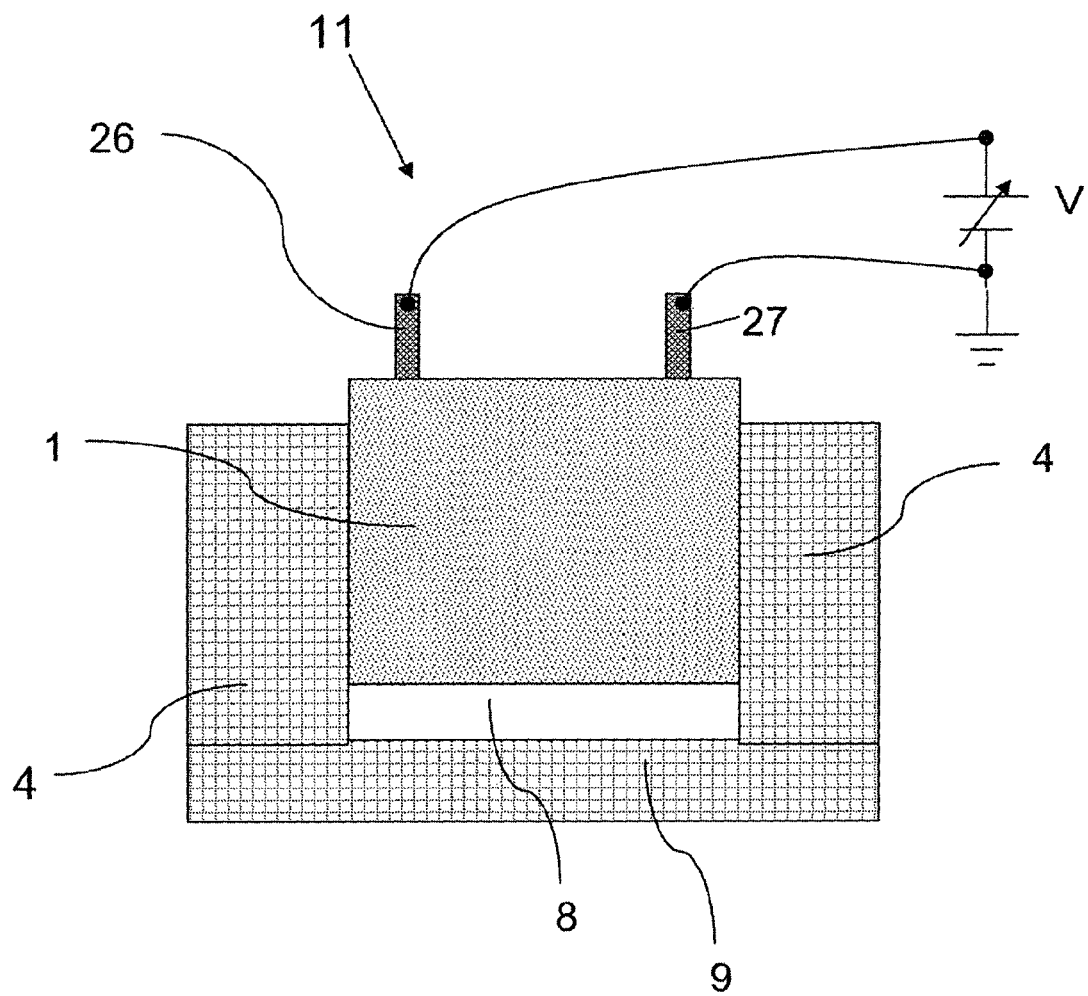
FIG. 5 shows a cross-sectional view of the valve according to the embodiment.

As shown in FIG. 5, two walls 4 are disposed on the substrate 9. The actuator 1 is fixed between these two walls 4. A flow path 8 is formed between the substrate 9 and the bottom surface of the actuator 1. Instead of the example shown in FIG. 5, a groove may be formed on the surface of the substrate to provide a flow path on the substrate. Note that FIG. 5 does not show the details of the actuator 1, such as the conductive polymer layer 31.

A negative voltage and a positive voltage are applied to the conductive polymer layer 31 and the opposite electrode layer 34, respectively, to increase the thickness of the conductive polymer layer 31. Since the bottom surface of the actuator 1 is brought into contact with the substrate 9, the flow of the fluid flowing flow through the flow path 8 is stopped.

Then, a positive voltage and a negative voltage are applied to the conductive polymer layer 31 and the opposite electrode layer 34, respectively, to decrease the thickness of the conductive polymer layer 31. Since the bottom surface of the conductive polymer layer 31 is left from the substrate, the fluid flows through the flow path 8.

EXAMPLE

The following examples describe the present invention in more detail.

Example 1

Figure 6A:
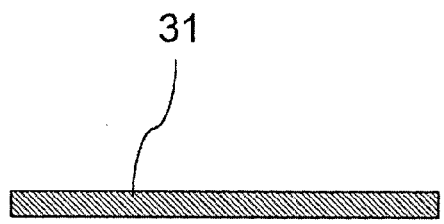
FIG. 6A shows the cross-sectional view in one step of the method for fabricating the actuator according to the embodiment.

As shown in FIG. 6A, the conductive polymer layer 31 was prepared. This conductive polymer layer 31 was fabricated in accordance with the method disclosed in Non Patent Literature 1 using a ionic liquid composed of 1-ethyl-3-methylimidazolium/bis(trifluoromethanesulfonyl)imide (hereinafter, referred to as "EMI/TFSI") as a solvent. The chemical reagents for the fabrication of the conductive polymer layer 31 were purchased from Sigma Aldrich Corporation.

The conductive polymer layer 31 was formed of polypyrrole/bis(trifluoromethanesulfonyl)imide (hereinafter, referred to as "PPy/TFSI"). The conductive polymer layer 31 had a length of 20 millimeters, a width of 20 millimeters, and a thickness of 70 micrometers.

Figure 6B:
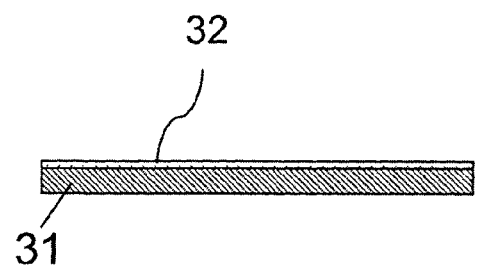
FIG. 6B shows a cross-sectional view in the step subsequent to FIG. 6A.

Then, as shown in FIG. 6B, the support layer 32 was formed on the conductive polymer layer 31. More specifically, an alloy layer (thickness: 20 nanometers) consisting of tungsten and titanium was formed on the conductive polymer layer 31 by sputtering. Subsequently, a gold layer having a thickness of 150 nanometers was stacked by sputtering. In this way, the support layer 32 was formed.

Figure 6C:
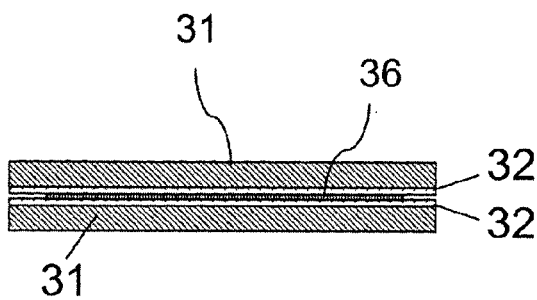
FIG. 6C shows a cross-sectional view in the step subsequent to FIG. 6B.
Figure 6D:
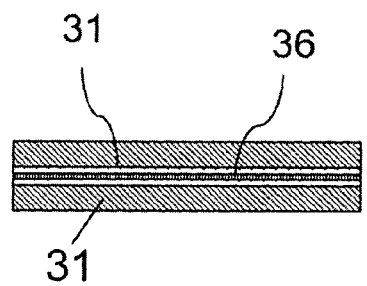
FIG. 6D shows a cross-sectional view in the step subsequent to FIG. 6C.

As shown in FIG. 6C, the two conductive polymer layer 31 each having the support layer 32 were adhered using an epoxide-based adhesive (purchased from Namics Company) in such a manner that the two support layers 32 face to each other. This adhesive corresponds to the adhesive film 36. Subsequently, both side ends of the conductive polymer layer 31 were cut using a YAG laser device, as shown in FIG. 6D.

Meanwhile, the opposite electrode layer 34 was prepared as shown in FIG. 7A. This opposite electrode layer 34 was fabricated by the method similar to that of the conductive polymer layer 31.

The opposite electrode layer 34 was formed of polypyrrole/dodecyl benzene sulfonic acid (hereinafter, referred to as "PPy/DBS").

Then, as shown in FIG. 7B, the adhesive layers 33 were formed on the conductive polymer layer 31. Similarly to the case of FIG. 7B, the adhesive layers 33 were also formed on the opposite electrode layer 34 as shown in FIG. 7C. The detail of the formation of the adhesive layer 33 will be described below.

Each adhesive layer 33 was formed by a stencil printing method. In the stencil method, a nickel mask (thickness: 20 micrometers) corresponding to FIG. 9 was used. This mask had a plurality of circular through-holes. Each circular through-hole had a radius of 40 micrometers. The distance interposed between the centers of the two adjacent through-holes was 260 micrometers.

A liquid adhesive was applied on the conductive polymer layer 31 and on the opposite electrode layer 34 by a stencil printing method. Subsequently, the adhesive was provisionally cured in an oven kept at 120 degrees Celsius for one minute. At this stage, the adhesive layer 33 had a radius of 45-50 micrometers and a height of approximately 16 micrometers.

Then, a plurality of the conductive polymer layers 31 shown in FIG. 7B and a plurality of the opposite electrode layers 34 shown in FIG. 7C were stacked alternately to form a laminated structure shown in FIG. 7D.

A weight of 250 grams was put on the top surface of the laminated structure. Then, the laminated structure was held in an oven maintained at 120 degrees Celsius for nine minutes to cure the adhesive completely. Afterwards, the weight was removed from the top surface.

A silver paste was applied to both sides of the laminated structure thus obtained to form the first electrode 26 and second electrode 27, as shown in FIG. 8A. The first electrode 26 was connected to the conductive polymer layer 31 electrically. The second electrode 27 was connected to the opposite electrode layer 34 electrically.

Then, as shown in FIG. 8B, the laminated structure was disposed in a case 20. Subsequently, a plate 22 and a rubber sheet 23 were fixed on the bottom surface of the laminated structure, using an adhesive (purchased from Namics Company). The plate 22 was formed of a quartz glass plate having a thickness of 0.5 millimeters. The rubber sheet 23 was formed of a silicone rubber sheet having a thickness of 0.1 millimeter.

As shown in FIG. 8C, a lid 24 was fixed to the case 20 using an adhesive (purchased from Huntsman Advanced Materials, trade name: Araldite Standard). The lid 24 consisted of quartz glass. The laminated structure was fixed to the lid 24 using an adhesive (purchased from Namics Company).

Finally, as shown in FIG. 8D, an EMI/TFSI ambient temperature molten salt (purchased from Sigma Aldrich Corporation) was injected to the case 20 through a through-hole 25 formed in the lid 24. The case 20 was filled with this EMI/TFSI ambient temperature molten salt. In this way, the ambient temperature molten salt layer 35 was formed.

Through the first electrode 26 and the second electrode 27, a voltage difference was applied between the conductive polymer layer 31 and the counter electrode 34. In more detail, cyclic bias voltages of −3.0 volts (for 100 seconds) and +3.7 volts (for 120 seconds) were applied alternately between the conductive polymer layer 31 and the counter electrode 34 for 10 hours. Ten hours later, the interspace, was not observed between the layers.

Comparative Example

An actuator was formed similarly to the case of the example except that the adhesive layers 33 were not formed. Subsequently, the pulsed wave was applied to this actuator similarly to that of the example. However, the interspaces were observed between the layers after the application of the pulse wave.

INDUSTRIAL APPLICABILITY

An actuator according to the present invention can be used in a biosensor.

REFERENCE SIGNS LIST

1: actuator
21: laminate
21a: first laminate
21b: second laminate
26: first electrode
27: second electrode
31: conductive polymer layer
31a: first conductive polymer layer
31b: second conductive polymer layer
32: support layer
32a: first support layer
32b: second support layer
33: adhesive layer
34: opposite electrode layer
35: ambient temperature molten salt layer
36: adhesive film
4: wall
8: flow path
9: substrate
11: valve
20: case
22: plate
23: rubber sheet
24: lid
25: through hole

The invention claimed is:

1. An actuator comprising:
a conductive polymer layer;
an ambient temperature molten salt layer; and
an opposite electrode layer; wherein
the ambient temperature molten salt layer is interposed between the conductive polymer layer and the opposite electrode layer,
the ambient temperature molten salt layer comprises an adhesive layer in the inside thereof;
one surface of the adhesive layer adheres to the conductive polymer layer; and
the other surface of the adhesive layer adheres to the opposite electrode layer.

2. The actuator according to claim 1, wherein
the ambient temperature molten salt layer comprises a plurality of adhesive layers in the inside thereof; and
the plurality of adhesive layers are dispersed in the ambient temperature molten salt layer when viewed in the perspective top view.

3. A method for driving an actuator, the method comprising:
(a) preparing the actuator comprising:
a conductive polymer layer;
an ambient temperature molten salt layer; and
an opposite electrode layer; wherein
the ambient temperature molten salt layer is interposed between the conductive polymer layer and the opposite electrode layer,
the ambient temperature molten salt layer comprises an adhesive layer in the inside thereof;
one surface of the adhesive layer adheres to the conductive polymer layer; and
the other surface of the adhesive layer adheres to the opposite electrode layer;
(b) applying a negative voltage and a positive voltage to the conductive polymer layer and the opposite electrode layer, respectively, to increase the thickness of the conductive polymer layer; and
(c) applying a positive voltage and a negative voltage to the conductive polymer layer and the opposite electrode layer, respectively, to decrease the thickness of the conductive polymer layer.

4. The method according to claim 3, wherein
the ambient temperature molten salt layer comprises a plurality of adhesive layers in the inside thereof; and
the plurality of adhesive layers are dispersed in the ambient temperature molten salt layer when viewed in the perspective top view.

5. A method for controlling a flow of a fluid flowing through a flow path, the method comprising;
(a) preparing the actuator comprising:
a conductive polymer layer;
an ambient temperature molten salt layer; and
an opposite electrode layer; wherein
the ambient temperature molten salt layer is interposed between the conductive polymer layer and the opposite electrode layer,
the ambient temperature molten salt layer comprises an adhesive layer in the inside thereof;
one surface of the adhesive layer adheres to the conductive polymer layer; and
the other surface of the adhesive layer adheres to the opposite electrode layer;
(b) applying a negative voltage and a positive voltage to the conductive polymer layer and the opposite electrode layer, respectively, to stop the flow of the fluid flowing through the flow path by increasing the thickness of the conductive polymer layer; and
(c) applying a positive voltage and a negative voltage to the conductive polymer layer and the opposite electrode layer, respectively, to flow the fluid through the flow path by decreasing the thickness of the conductive polymer layer.

6. The method according to claim 5, wherein
the ambient temperature molten salt layer comprises a plurality of adhesive layers in the inside thereof; and
the plurality of adhesive layers are dispersed in the ambient temperature molten salt layer when viewed in the perspective top view.

7. The method according to claim 5, wherein
the actuator is provided on a substrate;
in the step (b), a bottom surface of the actuator is brought into contact with the substrate; and
in the step (c), the bottom surface of the actuator is left from the substrate.

* * * * *